United States Patent
Jeng et al.

[11] Patent Number: 6,136,643
[45] Date of Patent: Oct. 24, 2000

[54] METHOD FOR FABRICATING CAPACITOR-OVER-BIT-LINE DYNAMIC RANDOM ACCESS MEMORY (DRAM) USING SELF-ALIGNED CONTACT ETCHING TECHNOLOGY

[75] Inventors: Erik S. Jeng; Chun-Yao Chen; Ing-Ruey Liaw, all of Hsinchu; Janmye Sung, Yang-Mei, all of Taiwan

[73] Assignee: Vanguard International Semiconductor Company, Hsin-Chu, Taiwan

[21] Appl. No.: 09/248,727

[22] Filed: Feb. 11, 1999

[51] Int. Cl.[7] .............................................. H01L 21/8242
[52] U.S. Cl. .................... 438/253; 438/254; 438/258; 438/259; 438/262; 438/267; 438/275; 438/299; 438/396; 438/397
[58] Field of Search .................................... 438/253, 254, 438/258, 259, 262, 267, 275, 299, 396, 397

[56] References Cited

U.S. PATENT DOCUMENTS

| | | | |
|---|---|---|---|
| 5,550,078 | 8/1996 | Sung | 437/52 |
| 5,670,404 | 9/1997 | Dai | 437/52 |
| 5,714,401 | 2/1998 | Kim et al. | 437/52 |
| 5,763,306 | 6/1998 | Tsai | 438/255 |
| 5,895,239 | 4/1999 | Jeng et al. | 438/239 |

Primary Examiner—David Nelms
Assistant Examiner—Quoc Hoang
Attorney, Agent, or Firm—George O. Saile; Stephen B. Ackerman

[57] ABSTRACT

A method for making capacitor-over-bit line (COB) DRAM using a self-aligned contact etching technology is achieved. After forming FET gate electrodes, sidewall spacers are formed from a first $Si_3N_4$ etch-stop layer, while a portion of the $Si_3N_4$ is retained as an etch-stop layer on the source/drain areas. Self-aligned contact openings are etched in a first oxide layer to the source/drain areas, and polysilicon landing plugs are formed in all the self-aligned openings. A second oxide layer is deposited and contact holes are etched to the landing plugs for bit lines. A polycide layer having a cap layer is deposited and patterned to form bit lines. A third $Si_3N_4$ etch-stop layer is conformally deposited over the bit lines and patterned to form openings over the landing plugs for the capacitor node contacts while forming $Si_3N_4$ sidewall spacers on the bit lines exposed in the openings. A third oxide layer is deposited, and openings having relaxed alignment tolerances, can be etched to the capacitor node contacts because the underlying third etch-stop layer prevents overetching. A conducting layer is deposited and etched back to form bottom electrodes in the openings, and the third oxide layer is removed, while the $Si_3N_4$ etch-stop layers prevents over-etching. An interelectrode dielectric layer is deposited, and capacitor top electrodes are formed.

22 Claims, 10 Drawing Sheets

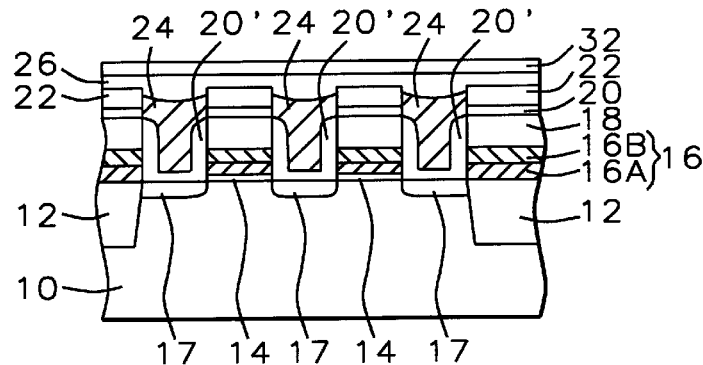
FIG. 9C
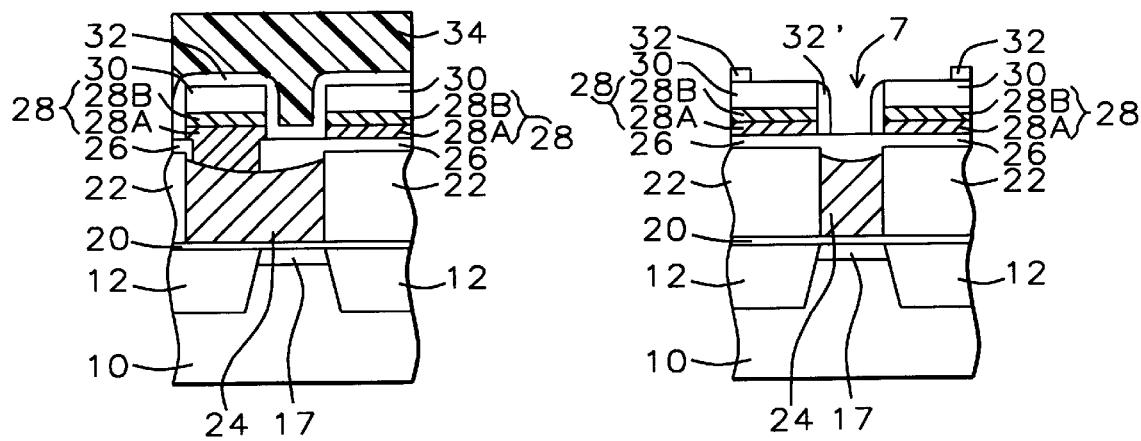
FIG. 10A          FIG. 10B
FIG. 10C

METHOD FOR FABRICATING CAPACITOR-OVER-BIT-LINE DYNAMIC RANDOM ACCESS MEMORY (DRAM) USING SELF-ALIGNED CONTACT ETCHING TECHNOLOGY

BACKGROUND OF THE INVENTION (1) Field of the Invention

This invention relates to an integrated circuit semiconductor device, and more particularly to a method for fabricating an array of memory cells using a blanket silicon nitride ($Si_3N_4$) etch-stop layer to form self-aligned contact holes for all landing plug contacts. Another blanket $Si_3N_4$ layer is used to etch $Si_3N_4$ spacers on bit lines only in selected areas while retaining the $Si_3N_4$ as an etch-stop layer elsewhere to prevent the capacitor node contacts from shorting to the bit lines when etching openings for forming the capacitors. This provides greater latitude in photolithographic alignment and in critical dimensions (CD).

(2) Description of the Prior Art

In recent years the number and density of memory cells on the DRAM chip have dramatically increased. The DRAM chip areas on the substrate consist of an array of closely spaced memory cells with address and read/write circuits along the periphery of the chip. Currently in production there are 64 million memory cells on a DRAM chip with minimum feature sizes less than a half micrometer. The individual DRAM cells are formed from a single access transistor, typically a field effect transistor (FET), and a storage capacitor with a node contact to one of the two source/drain areas of the FET. The capacitor is used for storing information in binary form (0's and 1's) as electrical charge, and the second source/drain area is connected to a bit line that is used to read and write information via peripheral circuits on the DRAM chip.

The number of memory cells on a DRAM chip is expected to exceed 1 Gigabit after the year 2000. This increased circuit density has resulted from the downsizing of the individual semiconductor devices (FETs) and the resulting increase in device packing density. The reduction in device minimum feature size is due in part to advances in high resolution photolithography and directional (anisotropic) plasma etching. For example, the minimum feature size is expected to be 0.25 to 0.18 micrometer (um) for the next generation of product. However, as minimum feature sizes decrease, it becomes increasingly more difficult to control the photolithographic alignment within design tolerances and to control the critical dimensions. Misalignment can inadvertently result in etching the underlying insulating layers that can cause electrical shorts between the various electrically conducting elements.

Several methods for making DRAM cells with increased memory cell density have been reported in the literature. One method of making DRAM capacitors is described in U.S. Pat. No. 5,714,401 to Kim et al. in which capacitor bottom electrodes are formed from a patterned conducting layer, and a second conducting layer is conformally deposited and etched back to form a fin-shaped structure under the bottom electrode for increased capacitance. Dai in U.S. Pat. No. 5,670,404 describes a method for making self-aligned bit line contacts on DRAMs using an undoped polysilicon layer as an etch-stop layer. The process uses a planar insulating layer that allows bit lines to be etched without conductive residue between the bit lines. In U.S. Pat. No. 5,763,306 to Tsai a method for making a high-density array of DRAM capacitors utilizing a deep pocket between the bit lines, that also forms the capacitor node contacts is described. Sung in U.S. Pat. No. 5,550,078 describes a method for making self-aligned bit line contacts and capacitor node contacts using a reduced mask set. This improves cell density and reduces manufacturing cost.

Therefore there is still a need in the industry to improve the process for fabricating DRAM devices which relax the need for critical photolithographic alignment and provides better control of critical dimensions (CD), while maintaining a cost-effective manufacturing process.

SUMMARY OF THE INVENTION

It is a principal object of the present invention to form an array of memory cells having self-aligned capacitor node contacts to word lines with capacitors having increased capacitance.

It is another object of the present invention to form these self-aligned node-contact-to-word-line structures with relaxed photolithographic alignment tolerance.

It is still another object of this invention to form all the landing plug contacts concurrently, thereby simplifying the process.

Yet another object of this invention is to form $Si_3N_4$ sidewall spacers on bit lines in selective areas while leaving a blanket $Si_3N_4$ layer, that serves as an etch-stop layer, elsewhere on the substrate to prevent capacitor node contacts from shorting to the landing plug contacts for the bit lines.

In accordance with the present invention, a method is provided for making DRAM capacitors having increased capacitance. The method uses several etch-stop layers composed of $Si_3N_4$ that prevent shorting between the capacitor node contacts and the landing plug contacts for the bit lines. This allows self-aligned contacts to be made with relaxed photolithographic alignment tolerances.

The method begins by providing a semiconductor substrate. Typically the substrate is a $P^-$ doped single-crystal silicon substrate having a <100> crystallographic orientation. Device areas are provided by forming a relatively thick Field OXide (FOX) that surrounds and electrically isolates each device area in and on the substrate. One method of forming the field oxide is by shallow trench isolation (STI) in which a shallow trench is etched in the substrate and filled with a silicon oxide ($SiO_2$) that is made essentially planar with the substrate surface. The FETs are formed by first growing a thin gate oxide on the device areas. A first polycide layer formed from a doped polysilicon layer and a refractory metal silicide layer with a $Si_3N_4/SiO_2$ cap oxide layer is patterned to form the FET gate electrodes having a cap oxide on the device areas, and concurrently to form word lines over the field oxide areas. Next, N doped source/drain areas are formed adjacent to the gate electrodes by ion implantation. A conformal first etch-stop layer, preferably $Si_3N_4$, is deposited on the substrate and partially etched back by anisotropic plasma etching to form sidewall spacers on the gate electrodes, while leaving portions of the first $Si_3N_4$ layer over the source/drain areas as an etch-stop. A first insulating layer, preferably composed of $SiO_2$, is deposited on the substrate and then planarized, for example by chemical/mechanical polishing (CMP). Next, self-aligned contact holes are etched in the first insulating layer selectively to the first etch-stop layer over the source/drain areas, and then the etch-stop layer in the contact holes is removed to expose the source/drain areas. A conductively doped first polysilicon layer is deposited and etched back to the first insulating layer to form polysilicon landing plugs for capacitor node contacts and for bit-line contacts in the contact holes. A second insulating layer, preferably $SiO_2$, is deposited on the substrate to insulate the landing plugs. Bit-line contact holes are etched in the second insulating layer to portions of the polysilicon landing plugs for the bit-line contacts. The bit lines are now formed by depositing a second polycide layer and depositing a second etch-stop layer, such as $Si_3N_4$. The polycide layer and the $Si_3N_4$ are patterned to form the bit lines extending over the bit-line contact holes. A conformal third etch-stop layer, also composed of $Si_3N_4$ is deposited over the bit lines and the second insulating layer. Using a photoresist mask and anisotropic plasma etching, the third etch-stop layer is patterned to form openings over the landing plugs for the capacitor node contacts, and at the same time forms sidewall spacers on the bit lines in the openings. The third etch-stop layer elsewhere on the substrate surface protects the underlying structure from etching during subsequent etching steps. A third insulating layer, such as $SiO_2$, is deposited and planarized. Openings for capacitor bottom electrodes are etched in the third insulating layer aligned over and larger than the openings in the third etch-stop layer, and are etched in the second insulating layer to the capacitor node contacts, while the third etch-stop layer in the capacitor openings prevents overetching. A conformal first conducting layer, preferably a doped polysilicon or titanium nitride, is deposited over the third insulating layer and in the capacitor openings. A polymer layer is deposited by spin coating to fill the capacitor openings and to form a planar surface, and is etched back to the first conducting layer on the top surface of the third insulating layer. Then the conducting layer is etched to the top surface of the third insulating layer to form an array of capacitor bottom electrodes in the capacitor openings, while the polymer in the capacitor openings prevents etching of the conducting layer in the openings. The polymer remaining in the capacitor openings is then removed, for example, by plasma ashing, and the remaining third insulating layer is selectively removed to the third etch-stop layer by wet etching in a hydrofluoric acid solution. An interelectrode dielectric layer, such as barium-strontium-titanium oxide $(BaSr)TiO_3$ commonly referred to as BST is formed on the bottom electrodes. Also, $Pb(Zr_xTi_{1-x})O_3$, commonly referred to as PZT, can be used as ferroelectric material to form non-volatile memory. A second conducting layer, such as polysilicon or titanium nitride, is deposited and patterned to form capacitor top electrodes and to complete DRAM cells.

BRIEF DESCRIPTION OF THE DRAWINGS

The objects and advantages of this invention are best understood with reference to the attached drawings in the figures and the embodiment that follows.

FIGS. 2A through 14C show schematic cross-sectional views for the sequence of process steps for fabricating the capacitor-over-bit line (COB) DRAM by the method of this invention. FIGS. 2A through 14A show the cross sections through bit-line contact. FIGS. 2B through 14B show the cross sections through one of the capacitor memory cells, and FIGS. 2C through 14C show the cross sections through both the capacitor memory cells and the common bit line contact.

DESCRIPTION OF THE PREFERRED EMBODIMENT

Figure 1:
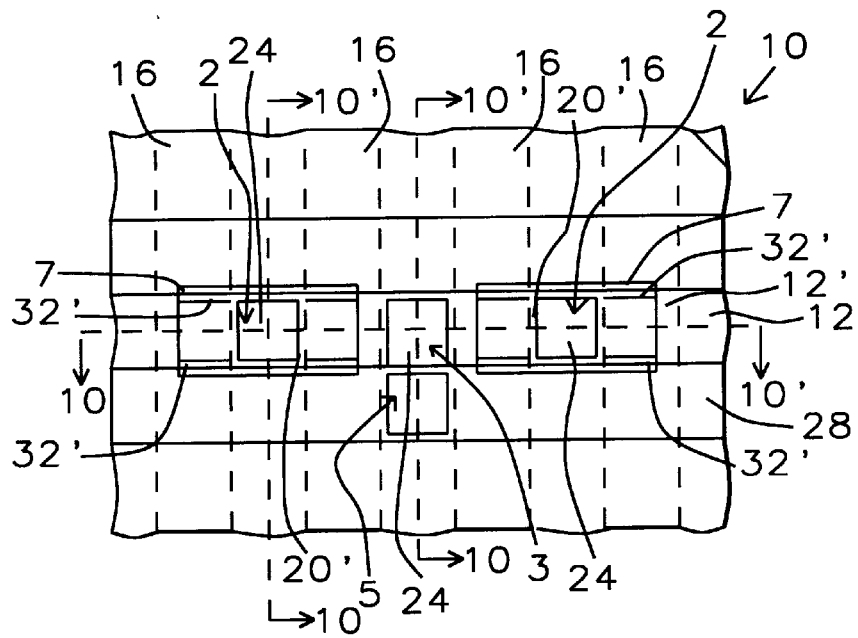
FIG. 1 is a schematic top view for this invention showing a layout of two adjacent memory cells having a common bit-line contact.

Referring now to the top view of FIG. 1 and the cross-sectional views in FIGS. 2A through 14C, the embodiment of this invention is described in detail. The cross sections in FIGS. 2A through 14A relate to the corresponding cross section 10A–10A' in FIG. 1, FIGS. 2B through 14B relate to the cross section 10B–10B', and FIGS. 2C through 14C relate to the cross section 10C–10C' in FIG. 1. The invention uses novel etch-stop layers and an etching technology to form improved DRAM circuits with relaxed photolithographic alignment tolerances and one-time formation of all landing plug contacts on the substrate. The invention also concurrently forms $Si_3N_4$ sidewall spacers on bit lines exposed in the open areas, while leaving a blanket etch-stop layer ($Si_3N_4$) elsewhere on the substrate. Although the process is described for making memory cells for DRAM devices having N-channel FETs as the access transistors, it should also be well understood by one skilled in the art that by including additional process steps, in addition to those described in this embodiment, other types of devices can be included on the DRAM chip. For example, by forming N-well regions in a P-doped substrate, P-channel FETs can also be provided from which can be formed Complementary Metal-Oxide-Semiconductor (CMOS) circuits required for the peripheral circuits on the DRAM chip.

To better appreciate this novel method for making DRAMs, a top view of two adjacent memory cells having a common bit-line contact is described with reference to FIG. 1. The top view shows the DRAM process after patterning the third $Si_3N_4$ etch-stop layer, as shown in the cross sections in FIGS. 10A, 10B, and 10C. The top view of FIG. 1 shows a substrate 10 having field oxide regions 12 surrounding and electrically isolating a device area 12'. A first polycide layer is patterned to form word lines 16 that extend over the device area 12' to form FET gate electrodes, also labeled 16, having $Si_3N_4$ sidewall spacers. After forming a planar first insulating layer over the gate electrodes 16, openings 2 are etched in the first insulating layer for the capacitor node contacts, and concurrently the bit-line contact openings 3 are etched. Polysilicon landing plugs 24 are formed in the openings 2 and 3. Then a second insulating layer is formed in which contact openings 5 are etched to the landing plugs 24 for the bit lines. A second polycide layer is deposited and patterned to form the bit lines 28 extending over the contact openings 5 to make contact to the bit-line polysilicon landing plugs 24. A key feature of this invention is the deposition of a $Si_3N_4$ third etch-stop layer 32 which is patterned using a photoresist mask to form openings 7 in layer 32 over the capacitor node landing plugs 24, while forming concurrently sidewall spacers 32' on the bit lines 28. The third $Si_3N_4$ etch-stop layer elsewhere on the substrate is retained as an etch stop to prevent overetching during subsequent etching steps, as will become apparent in subsequent FIGS. 11A through 14C.

Figure 2A:
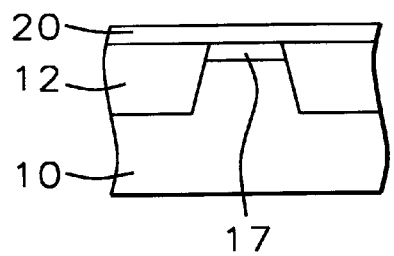
Figure 2B:
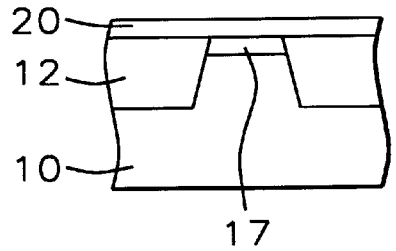
Figure 2C:
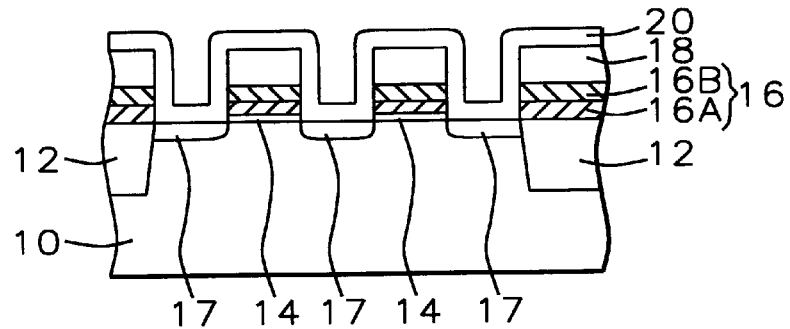

Referring now to FIGS. 2A through 14C, the method begins by providing a semiconductor substrate 10, as shown in FIGS. 2A–2C. Typically the substrate is a P⁻ doped single-crystal silicon having a <100> crystallographic orientation. A Field OXide (FOX) 12 is formed surrounding and electrically isolating each device area in and on the substrate 10. One preferred method of forming the field oxide is by shallow trench isolation (STI). Briefly the STI formation involves selectively etching shallow trenches between about 2000 and 4000 Angstroms, and depositing and etching a chemical-vapor-deposited (CVD) $SiO_2$ to fill the trenches and is essentially coplanar with the top surface of the substrate.

The FETs are formed next by first forming a thin gate oxide 14 on the device areas, as shown in FIG. 2C. Typically the gate oxide is formed by thermal oxidation and is grown to a thickness of between about 30 and 120 Angstroms. A first polycide layer 16 is deposited and patterned to form the FET gate electrodes 16 on the device areas and concurrently to form word lines 16 over the field oxide areas 12. Typically the polycide layer 16 consists of a heavily $N^+$ doped polysilicon layer 16A with a refractory metal silicide layer 16B, such as tungsten silicide ($WSi_2$), on the top surface. The polysilicon 16A can be deposited by low-pressure chemical vapor deposition (LPCVD) using silane ($SiH_4$) and is conductively doped N type with phosphorus (P). The $WSi_2$ layer 16B is deposited by CVD using tungsten hexafluoride ($WF_6$) and $SiH_4$ as the reactant gases. Polycide layer 16 is deposited to a total thickness of between 1500 and 2500 Angstroms. A cap oxide layer 18, composed of $SiO_2$ and $Si_3N_4$, is deposited over the polycide layer 16 before patterning the FET gate electrodes 16. Source/drain areas 17 are formed adjacent to the gate electrodes by ion implanting an N type dopant such as phosphorus (P). Typically the source/drain areas 17 are doped to a concentration of between about 1.0 E 17 and 1.0 E 19 atoms/cm$^3$.

Still referring to FIG. 2C, a conformal first etch-stop layer 20, preferably $Si_3N_4$, is deposited on the substrate over the gate electrodes 16 and also on the source/drain areas 17. The $Si_3N_4$ layer 20 is deposited by LPCVD using, for example, dichlorosilane ($SiCl_2H_2$) and ammonia ($NH_3$) as the reactant gases. The $Si_3N_4$ layer 20 is deposited to a thickness of between about 200 and 600 Angstroms. The $Si_3N_4$ layer 20 over the source/drain areas 17 for the bit line contacts is shown in FIG. 2A, while the $Si_3N_4$ layer 20 over the source/drain areas 17 for the capacitor node contacts is shown in FIG. 2B for the respective cross sections 10A–10A' and 10B–10B' in FIG. 1.

Figure 3A:
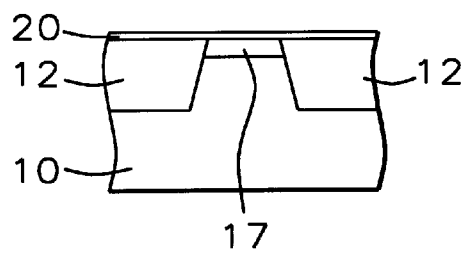
Figure 3B:
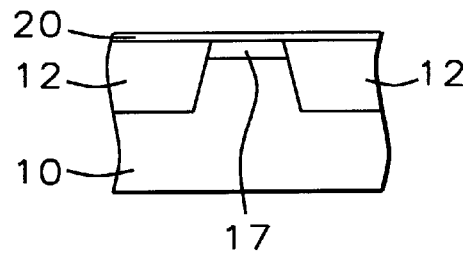
Figure 3C:
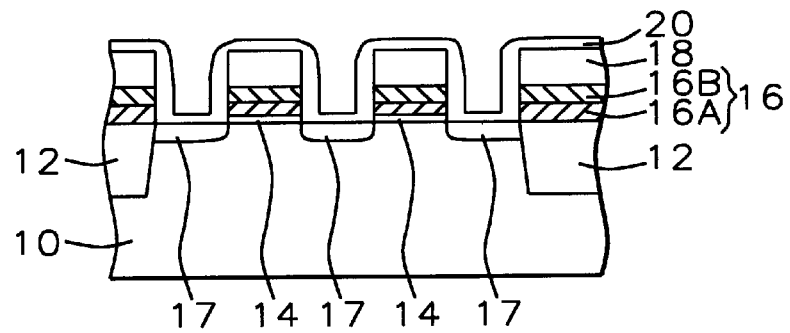

Referring to FIG. 3C, the $Si_3N_4$ first etch-stop layer 20 is then partially etched back by anisotropic plasma etching to form sidewall spacers 20' on the gate electrodes 16, while leaving portions of the first $Si_3N_4$ layer 20 over the source/drain areas 17 as an etch-stop layer. The anisotropic etching is preferably carried out using high-density-plasma (HDP) etching and an etchant gas mixture such as $CF_4$, $CHF_3$, $O_2$, and Ar. The corresponding cross sections for the bit line contacts and the capacitor node contacts are depicted in FIGS. 3A and 3B showing the partially etched back $Si_3N_4$ layer 20 over the source/drain areas 17.

Figure 4A:
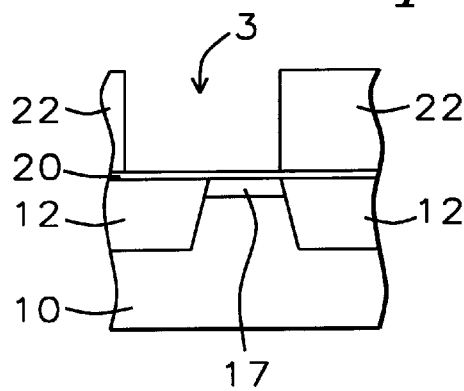
Figure 4B:
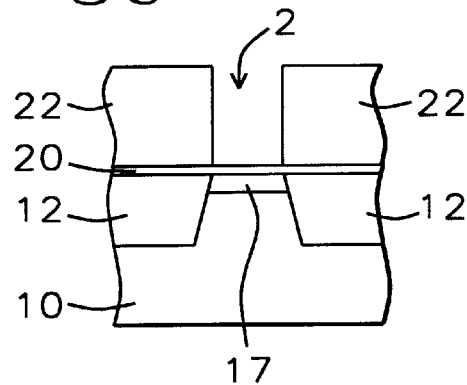
Figure 4C:
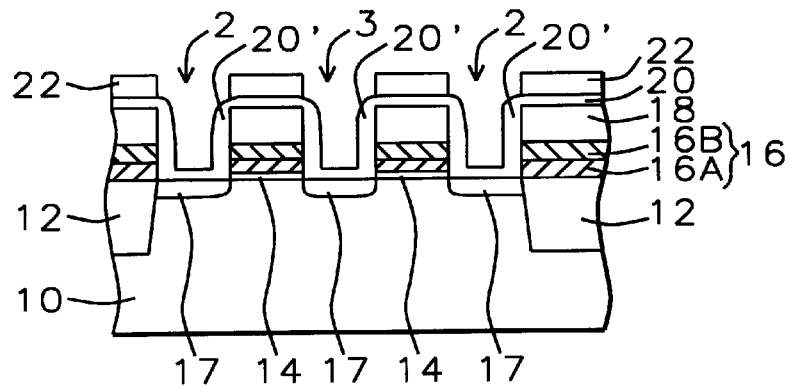

Referring to FIG. 4C, a first insulating layer 22, preferably composed of $SiO_2$, is deposited and planarized. Layer 22 is deposited by sub-atmospheric CVD or by plasma-enhanced CVD using a HDP oxide deposition tool and a reactant gas such as tetraethosiloxane (TEOS), or TEOS/ozone ($O_3$). The first insulating layer 22 is then planarized, for example by chemical/mechanical polishing (CMP), to leave a thickness of between about 1000 and 4000 Angstroms over the gate electrodes 16 having the cap oxide 18 and portions of the first etch-stop layer 20.

Still referring to FIG. 4C, contact holes 2 and 3 are etched selectively in the first insulating layer 22 to the first etch-stop layer 20 over the source/drain areas 17, and extending over the gate electrodes 16 to form self-aligned contacts. The contact holes 2 are etched for the capacitor node contacts, as shown in FIG. 4B, and the contact holes 3 are etched for the bit line contacts, as shown in FIG. 4A. The etching is preferably carried out using reactive ion etching (RIE) and an etchant gas that etches $SiO_2$ selectively to the $Si_3N_4$. For example, the etching can be carried out using an etchant gas mixture consisting of $C_4F_8$, CO, $O_2$, and Ar. Alternatively, a gas mixture of $C_5F_8$, CO, $O_2$, and Ar can also be used.

Figure 5A:
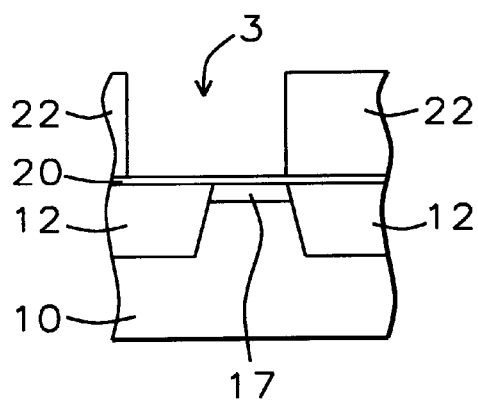
Figure 5B:
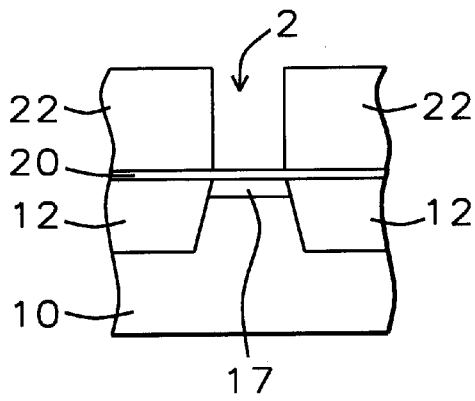
Figure 5C:
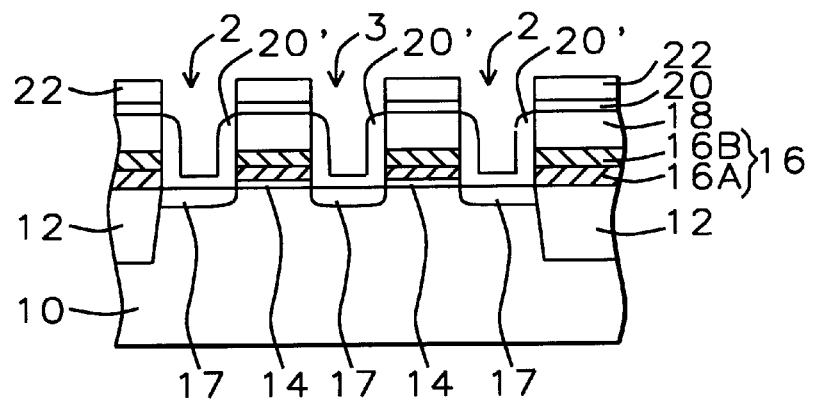

Referring to FIG. 5C, the first etch-stop layer 20 over the source/drain areas 17 exposed in the contact holes 2 and 3 is removed selectively to the silicon substrate 10. Preferably layer 20 is removed by selectively etching to the substrate using RIE and an etchant gas mixture such as $CHF_3$, $CH_3F$, $O_2$, and Ar. The removal of the $Si_3N_4$ layer 20 is also depicted in FIGS. 5A and 5B for the cross sections through 10A–10A' and 10B–10B' of FIG. 1.

Figure 6A:
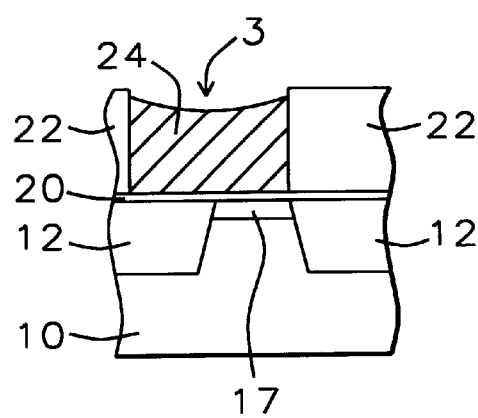
Figure 6B:
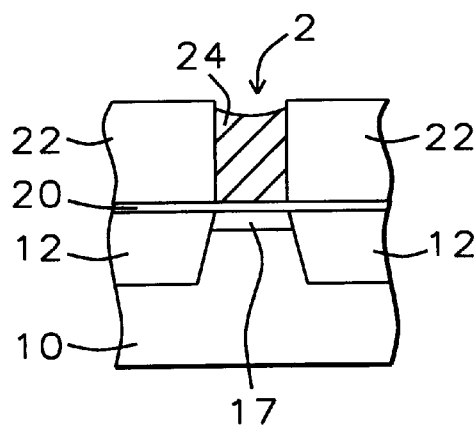
Figure 6C:
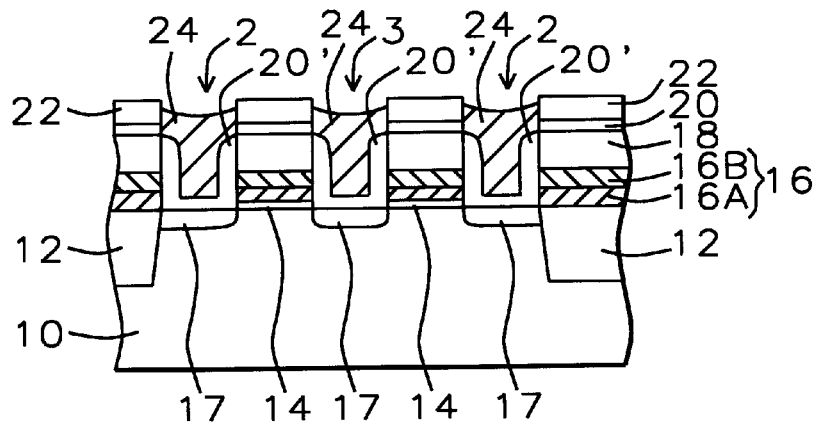

Referring to FIGS. 6A–6C, a conductively doped first polysilicon layer 24 is deposited on the first insulating layer 22 to a thickness sufficient to fill the openings 2 and 3. Layer 24 is deposited preferably by LPCVD using $SiH_4$ as the reactant gas, and is in-situ doped with an $N^+$ conductive type dopant to a concentration of between about 1.0 E 19 and 1.0 E 20 atoms/cm$^3$. For example, the first polysilicon layer 24 can be doped by adding phosphine ($PH_3$) during the polysilicon deposition. Polysilicon layer 24 is then etched back to the top surface of the first insulating layer 22 to form polysilicon landing plugs 24 in the contact holes 2 and 3 for capacitor node contacts and for bit-line contacts, respectively. The polysilicon layer 24 is etched selectively to the $SiO_2$ layer 22 using a HDP etcher and an etchant gas mixture such as $Cl_2$, HBr, $O_2$, and He.

Figure 7A:
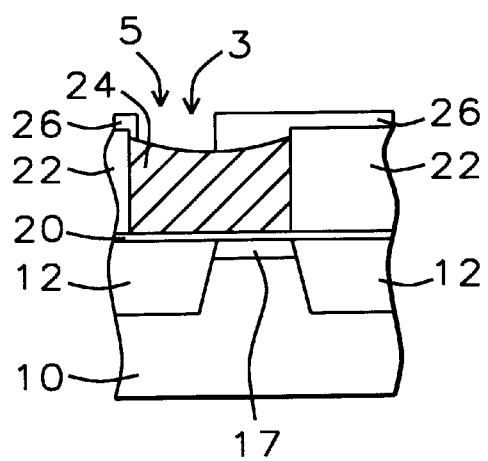
Figure 7B:
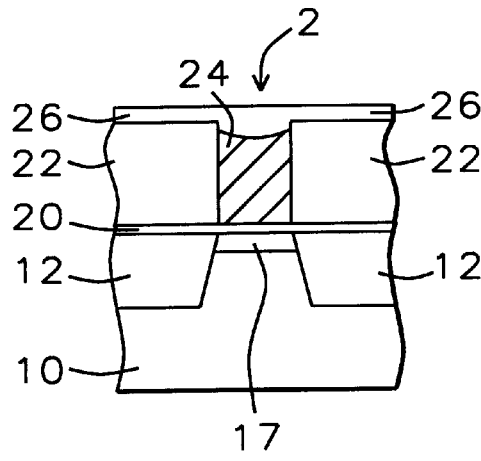
Figure 7C:
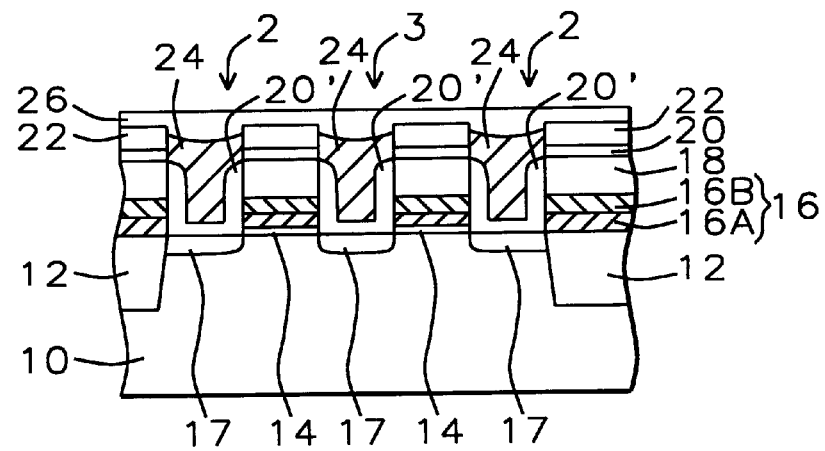

Referring to FIGS. 7A–7C, a second insulating layer 26 is deposited on the substrate to insulate the polysilicon landing plugs 24 in the openings 2 and 3. Layer 26 is preferably $SiO_2$ deposited by LPCVD using a reactant gas such as TEOS/$O_3$. Alternatively, layer 26 can also be a silicon oxynitride (SiON), deposited by LPCVD using a reactant gas such as $SiH_4$, $NH_3$, and $N_2O$. The second insulating layer 26 is deposited to a thickness of between about 1000 and 2000 Angstroms.

Referring now more specifically to FIG. 7A and the top view in FIG. 1, bit-line contact holes 5 are etched in the second insulating layer 26 to portions of the polysilicon landing plugs 24 in the openings 3 for making bit-line contacts. The contact openings 5 are etched using HDP or reactive ion etching and an etchant gas mixture such as $CF_4$, $CHF_3$, $O_2$, and Ar.

Figures 8A, 8B:
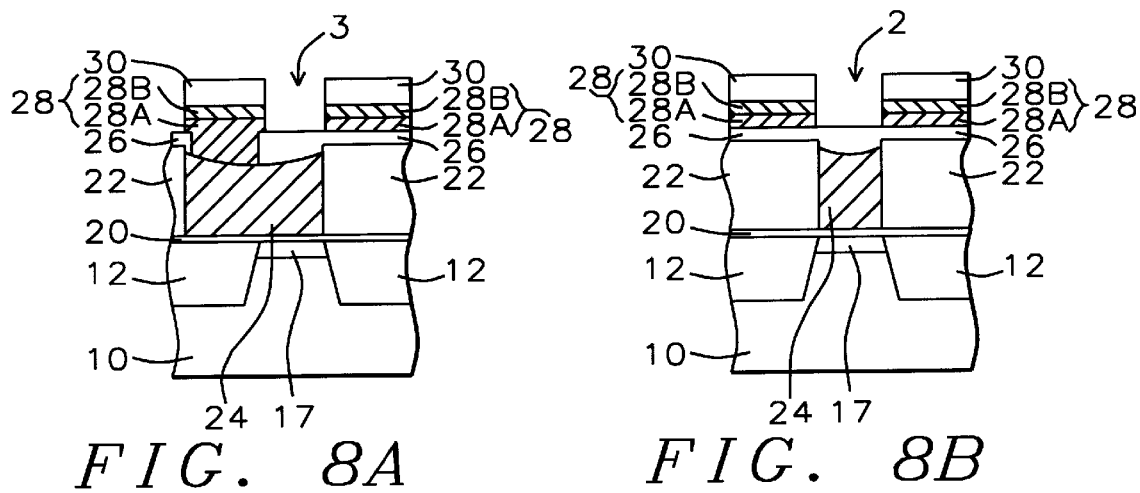
Figure 8C:
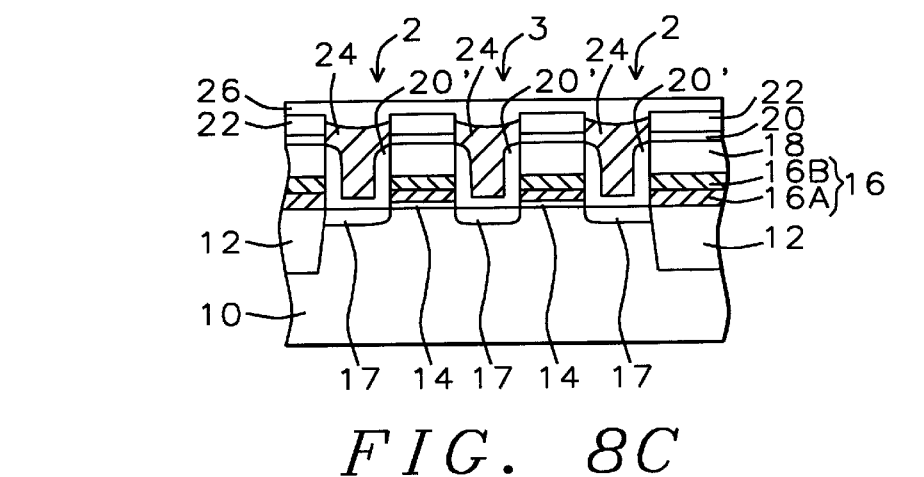

Referring to FIGS. 8A–8C, a second polycide layer 28 is formed by depositing a doped polysilicon layer 28A followed by the deposition of a refractory metal silicide layer 28B. The polysilicon layer 28A is deposited by LPCVD using $SiCl_2H_2$, and is in-situ doped with phosphorus to a concentration of between about 1.0 E 20 and 1.0 E 22 atoms/cm$^3$. The polysilicon layer 28A is deposited to a thickness of between about 500 and 1500 Angstroms. The silicide layer 28B is preferably tungsten silicide ($WSi_2$) deposited by CVD using a reactant gas such as tungsten hexafluoride ($WF_6$) and $SiH_4$, and is deposited to a thickness of between about 1000 and 1500 Angstroms. Alternatively a tungsten metal layer can be used in place of the silicide layer 28B. A second etch-stop layer 30, preferably $Si_3N_4$, is deposited on the polycide layer 28 by LPCVD using $SiCl_2H_2$ and $NH_3$. The $Si_3N_4$ etch-stop layer 30 is deposited to a thickness of between about 1500 and 3000 Angstroms. Conventional photolithographic techniques and anisotropic etching are then used to pattern layers 30, 28A, and 28B to form the bit lines 28. The bit lines are patterned to extend over the bit line contact holes 5 and contacting the polysilicon landing plugs 24 in the contact openings 3, as shown in FIG. 8A and as shown in the top view in FIG. 1. FIG. 8B shows a cross section through the area 10B–10B' of FIG. 1 for two adjacent bit lines 28 and one of the capacitor node contact landing plugs 24.

Figures 9A, 9B:
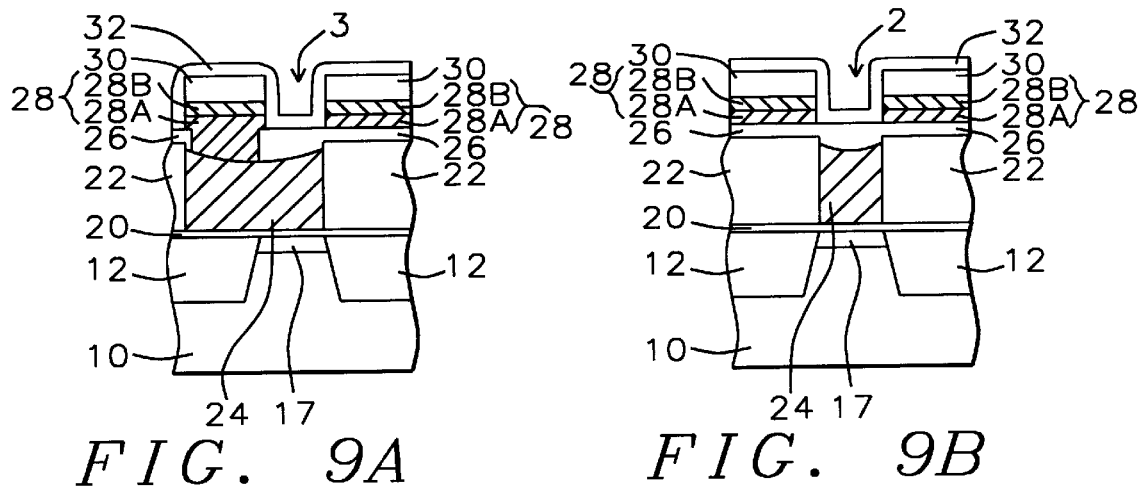

Referring to FIGS. 9A–9C, a conformal third etch-stop layer 32, also composed of $Si_3N_4$, is deposited over the bit lines 28, as shown in FIGS. 9A and 9B, and over the second insulating layer 30, as shown in FIG. 9C. The Si$_3$N$_4$ layer 32 is deposited by CVD, similar to the deposition of the first and second etch-stop layers. The third etch-stop layer 32 is deposited to a thickness of between about 200 and 600 Angstroms.

Referring now to FIGS. 10A–10C and a key feature of this invention, a photoresist mask 34 and anisotropic plasma etching are used to etch openings 7 in the third etch-stop layer 32. The openings 7 are etched over the landing plugs 24 for the capacitor node contacts, as shown in the top view of FIG. 1, and in the cross-sectional views of FIGS. 10B and 10C. The third etch-stop layer 32 is retained elsewhere on the substrate as shown in FIGS. 10A and 10C over the bit line contact landing plugs 24, to prevent unwanted etching during subsequent etching steps. Concurrently, Si$_3$N$_4$ sidewall spacers 32' are formed on the bit lines 28 exposed in the openings 7, as shown in FIG. 10B, during anisotropic etching of layer 32.

Figures 11A, 11B:
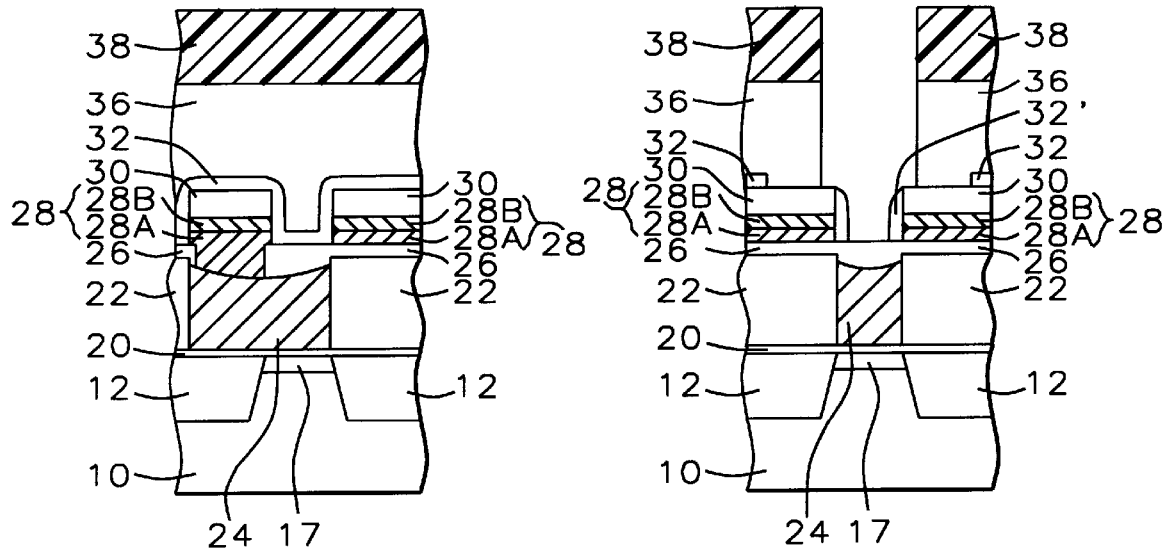
Figure 11C:
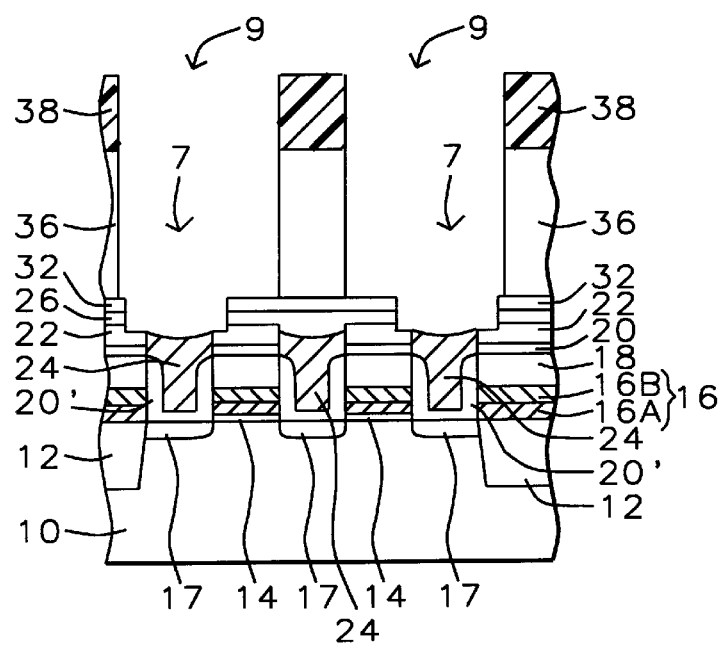

Referring to FIGS. 11A–11C, a relatively thick disposable third insulating layer 36 is deposited and planarized. Layer 36 is preferably SiO$_2$ and is deposited by SACVD using TEOS/O$_3$ and is planarized by CMP to have a thickness of between about 8000 and 12000 Angstroms over the bit lines 28. A patterned photoresist mask 38 is used to etch openings 9 for forming capacitor bottom electrodes. The openings 9 are etched in the third insulating layer 36 aligned over and larger than the openings 7 in the third etch-stop layer 32, as depicted in FIG. 11C. The openings 9 are etched selectively to the underlying second and third etch-stop layers 30 and 32, as shown in FIGS. 11B and 11C, respectively, while the Si$_3$N$_4$ sidewall spacers 32' electrically insulate the bit lines 28, as shown in FIG. 11B. The etch-stop layers 30 and 32 also serve as a hard mask for selectively etching openings in the second insulating layer 26 to the capacitor node landing plug contacts 24. The etching is preferably carried out using RIE and an etchant gas mixture such as C$_4$F$_8$, CO, O$_2$, and Ar, or a gas mixture of C$_5$F$_8$, CO, O$_2$, and Ar that etches SiO$_2$ selectively to Si$_3$N$_4$, and having an etch-rate selectivity greater than 10:1. The third etch-stop layer 32 having openings 7 simplifies the etching complexity and relaxes the control on photolithographic alignment, more specifically, for aligning the photoresist mask 38.

Figure 12A:
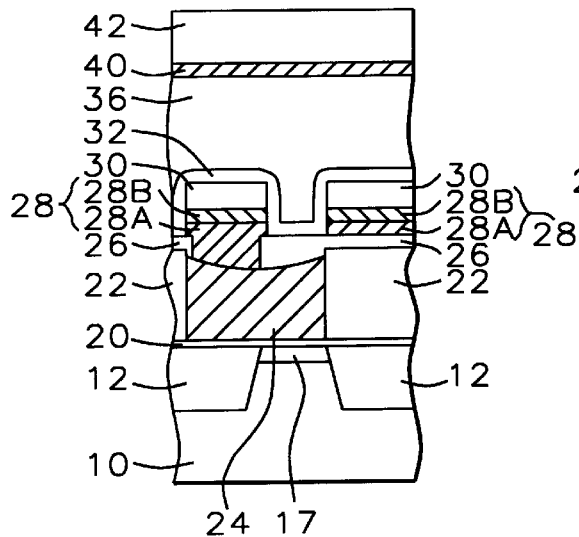
Figure 12B:
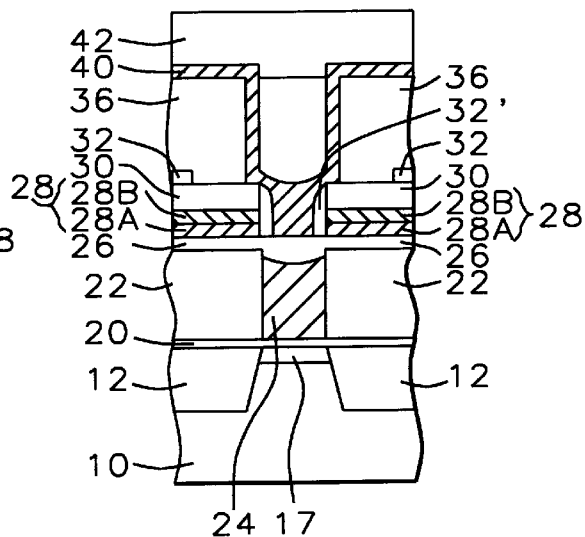
Figure 12C:
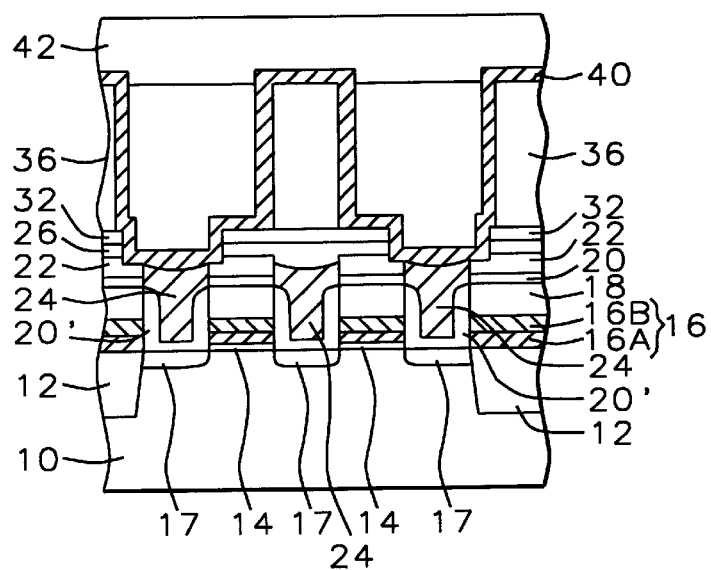

Referring to FIGS. 12A–12C, after removing the photoresist mask 38, a conformal first conducting layer 40 is deposited over the third insulating layer 36 and in the capacitor openings 9, making electrical contact to the landing plugs 24, as shown in FIGS. 12B and 12C. Layer 40 is preferably a doped polysilicon, deposited by LPCVD, and is doped in situ with phosphorus to a concentration of between about 1.0 E 20 and 1.0 E 22 atoms/cm$^3$, and is deposited to a thickness of between about 300 and 600 Angstroms. Alternatively, layer 40 can be a titanium nitride, deposited by CVD using a reactant gas such as TiCl$_4$ and SiH$_4$.

Still referring to FIGS. 12A–12C, a polymer layer 42 is deposited by spin coating to a thickness sufficient to fill the capacitor openings 9 and to form a planar surface on the substrate. The polymer layer 42 is etched back, for example by plasma etching in oxygen, to the first conducting layer 40 on the top surface of the third insulating layer 36. Then the conducting layer 40 is etched back to the top surface of the third insulating layer 36 to form an array of capacitor bottom electrodes in the capacitor openings 9, while the polymer 42 in the capacitor openings prevents etching of the conducting layer 40 in the openings 9. Alternatively, the polymer layer 42 and the first conducting layer 40 can be chemically/mechanically polished back to the surface of the third insulating layer 36.

Figure 13A:
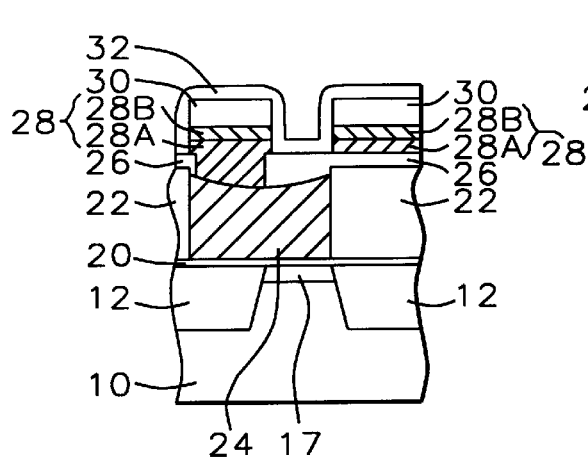
Figure 13B:
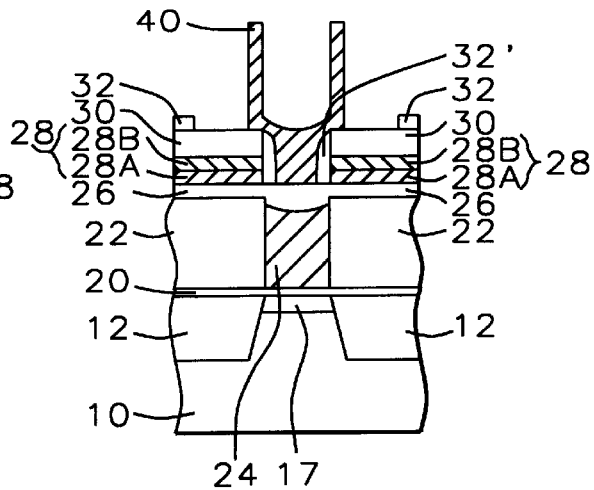
Figure 13C:
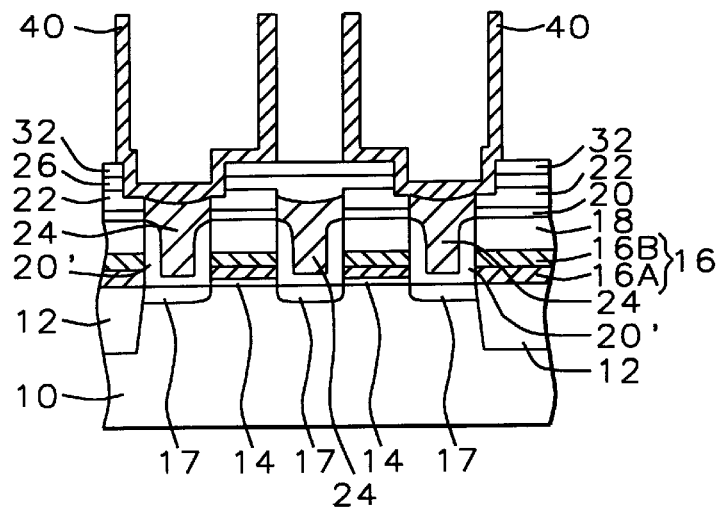

Referring to FIGS. 13A–13C, the polymer layer 42 remaining in the capacitor openings is then removed using plasma ashing in oxygen. The remaining disposable third insulating layer 36 is selectively removed to the third etch-stop layer 32 using a wet etch in a hydrofluoric (HF) acid solution or a vapor HF, resulting in free-standing bottom electrodes 40, as shown in FIGS. 13B and 13C. The third etch-stop layer 32 protects the remaining substrate surface from etching, as depicted for the bit line contact area shown in FIG. 13A.

Figure 14A:
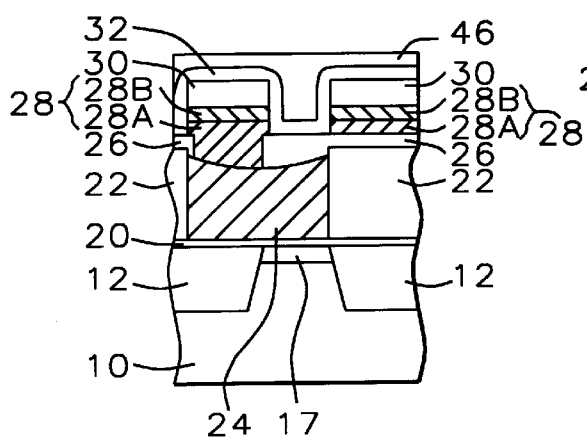
Figure 14B:
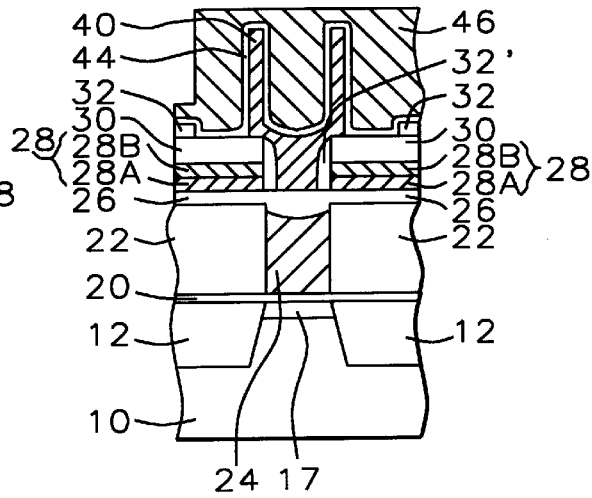
Figure 14C:
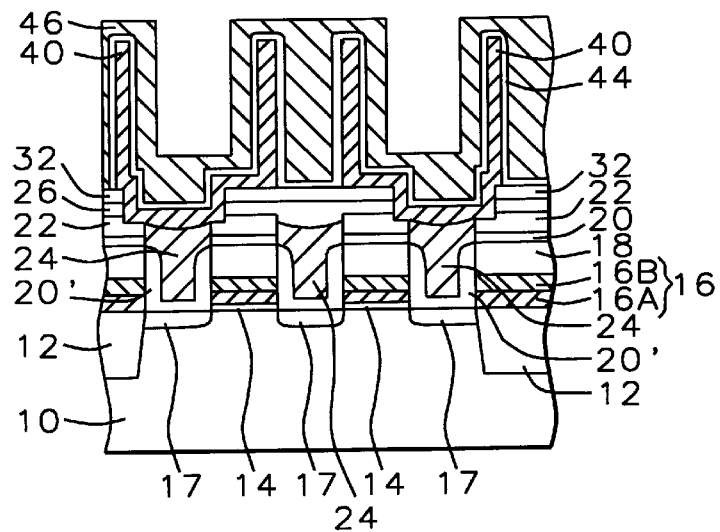

Referring to FIGS. 14A–14C, an interelectrode dielectric layer 44 is deposited on the bottom electrodes 40, as shown in FIGS. 14B and 14C. Preferably layer 44 is a material having a high relative permittivity (dielectric constant k), such as tantalum pentoxide (Ta$_2$O$_5$). Another material having a high relative permittivity that can be used is barium-strontium-titanium oxide (BaSr)TiO$_3$ commonly referred to as BST. The interelectrode dielectric layer 44 is deposited to a thickness of between about 50 and 200 Angstroms. Alternatively, other exotic materials, such as ferroelectric materials having high permittivity, can be used to form non-volatile memory. For example, Pb(Zr$_x$Ti$_{1-x}$)O$_3$, commonly referred to as PZT, can be used for layer 44. One method of depositing these layers is by metal organic chemical vapor deposition (MOCVD).

Continuing with FIGS. 14A–14C, a second conducting layer 46, such as a titanium nitride (TiN) deposited by CVD using a reactant gas mixture such as TiCl$_4$ and NH$_3$. Alternatively, second conducting layer 46 can be a doped polysilicon, deposited by LPCVD using SiH$_4$ and in-situ doped with PH$_3$ to a phosphorus concentration of between about 1.0 E 20 and 1.0 E 22 atoms/cm$^3$. Layer 46 is deposited to a thickness of between about 500 and 1500 Angstroms, and is patterned to form top electrodes to complete the capacitors for the DRAM cells.

While the invention has been particularly shown and described with reference to the preferred embodiment thereof, it will be understood by those skilled in the art that various changes in form and details may be made without departing from the spirit and scope of the invention.

What is claimed is:

1. A method for fabricating capacitor-over-bit-line dynamic random access memory (DRAM) cells on a semiconductor substrate, comprising the steps of:

providing said semiconductor substrate having device areas surrounded by field oxide regions;

depositing and patterning a first polycide layer having a cap oxide to form field-effect-transistor (FET) gate electrodes on said device areas and to form word lines extending over said field oxide regions;

forming doped source/drain areas adjacent to said gate electrodes in said substrate;

depositing a conformal first etch-stop layer on said substrate and anisotropically plasma etching back partially to form sidewall spacers on said gate electrodes, while leaving portions of said first etch-stop layer over said source/drain areas;

depositing and planarizing a first insulating layer on said substrate;

etching self-aligned contact holes in said first insulating layer to said etch-stop layer over said source/drain areas;

selectively removing said etch-stop layer over said source/drain areas;

depositing a conductively doped first polysilicon layer and etching back to form polysilicon landing plugs in said contact holes to said source/drain areas for capacitor node contacts and for bit-line contacts;

depositing a second insulating layer on said substrate;

etching bit-line contact holes to portions of said polysilicon landing plugs for said bit-line contacts;

depositing a second polycide layer;

depositing a second etch-stop layer on said second polycide layer;

patterning said second etch-stop layer and said second polycide layer to form bit lines extending over said bit-line contact holes;

depositing a conformal third etch-stop layer;

patterning said third etch-stop layer to form openings over said landing plugs for said capacitor node contacts, while said third etch-stop layer protects remaining surface of said substrate from etching;

depositing and planarizing a third insulating layer;

etching selectively capacitor openings in said third insulating layer aligned over and larger than said openings in said third etch-stop layer and to said capacitor node contacts, while said third etch-stop layer in said capacitor openings prevents overetching;

depositing a conformal first conducting layer over third insulating layer and in said capacitor openings;

spin coating a polymer layer to form a planar surface, and etching back said polymer layer and said first conducting layer on top surface of said third insulating layer to form an array of capacitor bottom electrodes in said capacitor openings;

removing remaining said polymer layer in said capacitor openings and selectively removing said third insulating layer to said third etch-stop layer;

forming an interelectrode dielectric layer on said bottom electrodes;

depositing and patterning a second conducting layer to form capacitor top electrodes and to complete said DRAM cells.

2. The method of claim 1, wherein said first etch-stop layer is silicon nitride deposited by low-pressure chemical vapor deposition (LPCVD) to a thickness of between about 200 and 600 Angstroms, and is partially etched back over said source/drain areas.

3. The method of claim 1, wherein said first insulating layer is silicon oxide and has a thickness after planarizing of between about 1000 and 4000 Angstroms over said word lines.

4. The method of claim 1, wherein said first polysilicon layer is deposited by LPCVD and is doped to a concentration of between about 1.0 E 19 and 1.0 E 20 atoms/cm$_3$.

5. The method of claim 1, wherein said second insulating layer is silicon oxide and is deposited to a thickness of between about 1000 and 2000 Angstroms.

6. The method of claim 1, wherein said second polycide layer is a layer of N$^+$ doped polysilicon having a thickness of between about 500 and 1000 Angstroms, and a top refractory metal silicide layer having a thickness of between about 1000 and 1500 Angstroms.

7. The method of claim 1, wherein said third etch-stop layer is silicon nitride deposited by LPCVD to a thickness of between about 200 and 600 Angstroms.

8. The method of claim 1, wherein said third insulating layer is silicon oxide and after planarization has a thickness of between about 8000 and 12000 Angstroms over said bit lines.

9. The method of claim 1, wherein said first and second conducting layers are conductively doped polysilicon.

10. The method of claim 1, wherein said first and second conducting layers are titanium nitride.

11. The method of claim 1, wherein said interelectrode dielectric layer is an insulator and is formed to a thickness of between about 50 and 200 Angstroms.

12. A method for fabricating capacitor-over-bit-line dynamic random access memory (DRAM) cells on a semiconductor substrate, comprising the steps of:

providing said semiconductor substrate having device areas surrounded by field oxide regions;

depositing and patterning a first polycide layer having a cap oxide to form field-effect-transistor (FET) gate electrodes on said device areas and to form word lines extending over said field oxide regions;

forming doped source/drain areas adjacent to said gate electrodes in said substrate;

depositing a conformal first silicon nitride etch-stop layer on said substrate and anisotropically plasma etching back partially to form sidewall spacers on said gate electrodes, while leaving portions of said first silicon nitride etch-stop layer over said source/drain areas;

depositing and planarizing a first insulating layer on said substrate;

etching self-aligned contact holes in said first insulating layer to said first etch-stop layer over said source/drain areas;

selectively removing said first etch-stop layer over said source/drain areas;

depositing a conductively doped first polysilicon layer and etching back to form polysilicon landing plugs in said contact holes to said source/drain areas for capacitor node contacts and for bit-line contacts;

depositing a second insulating layer on said substrate;

etching bit-line contact holes to portions of said polysilicon landing plugs for said bit-line contacts;

depositing a second polycide layer;

depositing a second silicon nitride etch-stop layer on said second polycide layer;

patterning said second silicon nitride etch-stop layer and said second polycide layer to form bit lines extending over said bit-line contact holes;

depositing a conformal third silicon nitride etch-stop layer;

patterning said third etch-stop layer to form openings over said landing plugs for said capacitor node contacts, while said third etch-stop layer protects remaining surface of said substrate from etching;

depositing and planarizing a third insulating layer;

etching selectively capacitor openings in said third insulating layer aligned over and larger than said openings in said third silicon nitride etch-stop layer and to said capacitor node contacts, while said third etch-stop layer in said capacitor openings prevents overetching;

depositing a conformal first conducting layer over third insulating layer and in said capacitor openings;

spin coating a polymer layer to form a planar surface, and etching back said polymer layer and said first conducting layer on top surface of said third insulating layer to form an array of capacitor bottom electrodes in said capacitor openings;

removing remaining said polymer layer in said capacitor openings and selectively removing said third insulating layer to said third etch-stop layer;

forming an interelectrode dielectric layer on said bottom electrodes;

depositing and patterning a second conducting layer to form capacitor top electrodes and to complete said DRAM cells.

13. The method of claim 12, wherein said first silicon nitride etch-stop layer is deposited by low-pressure chemical vapor deposition (LPCVD) to a thickness of between about 200 and 600 Angstroms, and is partially etched back over said source/drain areas.

14. The method of claim 12, wherein said first insulating layer is silicon oxide and has a thickness after planarizing of between about 1000 and 4000 Angstroms over said word lines.

15. The method of claim 12, wherein said first polysilicon layer is deposited by LPCVD and is doped to a concentration of between about 1.0 E 19 and 1.0 E 20 atoms/cm$^3$.

16. The method of claim 12, wherein said second insulating layer is silicon oxide and is deposited to a thickness of between about 1000 and 2000 Angstroms.

17. The method of claim 12, wherein said second polycide layer is a layer of N$^+$ doped polysilicon having a thickness of between about 500 and 1500 Angstroms, and a top refractory metal silicide layer having a thickness of between about 1000 and 1500 Angstroms.

18. The method of claim 12, wherein said third silicon nitride etch-stop layer is deposited by LPCVD to a thickness of between about 200 and 600 Angstroms.

19. The method of claim 12, wherein said third insulating layer is silicon oxide and after planarization has a thickness of between about 8000 and 12000 Angstroms over said bit lines.

20. The method of claim 12, wherein said first and second conducting layers are conductively doped polysilicon.

21. The method of claim 12, wherein said first and second conducting layers are titanium nitride.

22. The method of claim 12, wherein said interelectrode dielectric layer is an insulator and is formed to a thickness of between about 50 and 200 Angstroms.

* * * * *